United States Patent [19]
Pond

[11] 3,938,056
[45] Feb. 10, 1976

[54] METHOD AND APPARATUS FOR ENHANCING THE OUTPUT FROM A TRAVELING WAVE TUBE

[75] Inventor: Norman H. Pond, Los Altos, Calif.
[73] Assignee: Teledyne, Inc., Los Angeles, Calif.
[22] Filed: Jan. 18, 1971
[21] Appl. No.: 107,404

[52] U.S. Cl. ................................. 330/43; 330/53
[51] Int. Cl.² ..................................... H03F 3/58
[58] Field of Search ............................ 330/43, 53

[56] References Cited
UNITED STATES PATENTS

| | | | |
|---|---|---|---|
| 3,418,605 | 12/1968 | Hair et al. | 333/24.1 |
| 3,426,291 | 2/1969 | Waglein et al. | 330/43 |
| 3,440,573 | 4/1969 | Butler | 333/73 R X |
| 3,566,311 | 2/1971 | Buck | 333/84 M X |

Primary Examiner—Nathan Kaufman
Attorney, Agent, or Firm—Limbach, Limbach & Sutton

[57] ABSTRACT

Method and apparatus are described for reducing amplifier distortion by establishing a first signal at a first frequency to be amplified in an amplifier which while amplifying the first signal produces a second undesired signal at another frequency, producing on a cycle by cycle basis of the first signal a third signal at the other frequency, adjusting by no more than substantially 180° the relative phase and amplitude of the first and third signals for mutual cancellation of the second and third signals and then amplifying the first signal in the amplifier and reducing the power of signals at the other frequency relative to the power of the amplifier signal at the first frequency. Examples are given where the second signal is a harmonic or an intermodulation frequency signal of the first signal.

4 Claims, 25 Drawing Figures

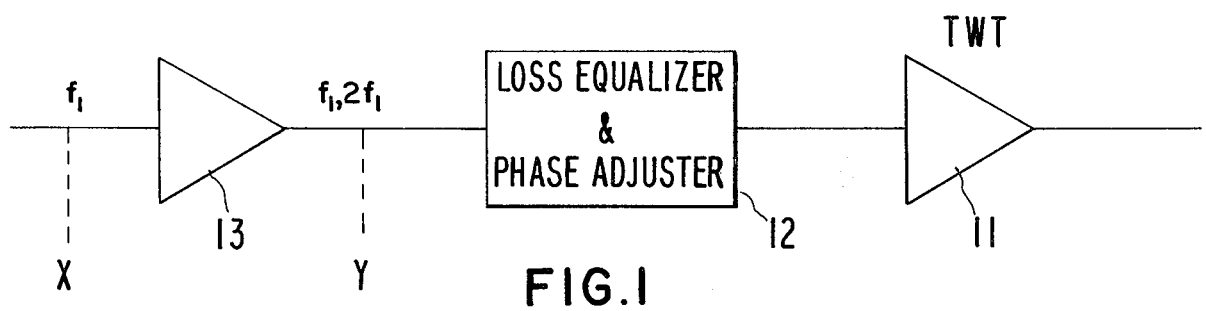
FIG. 1
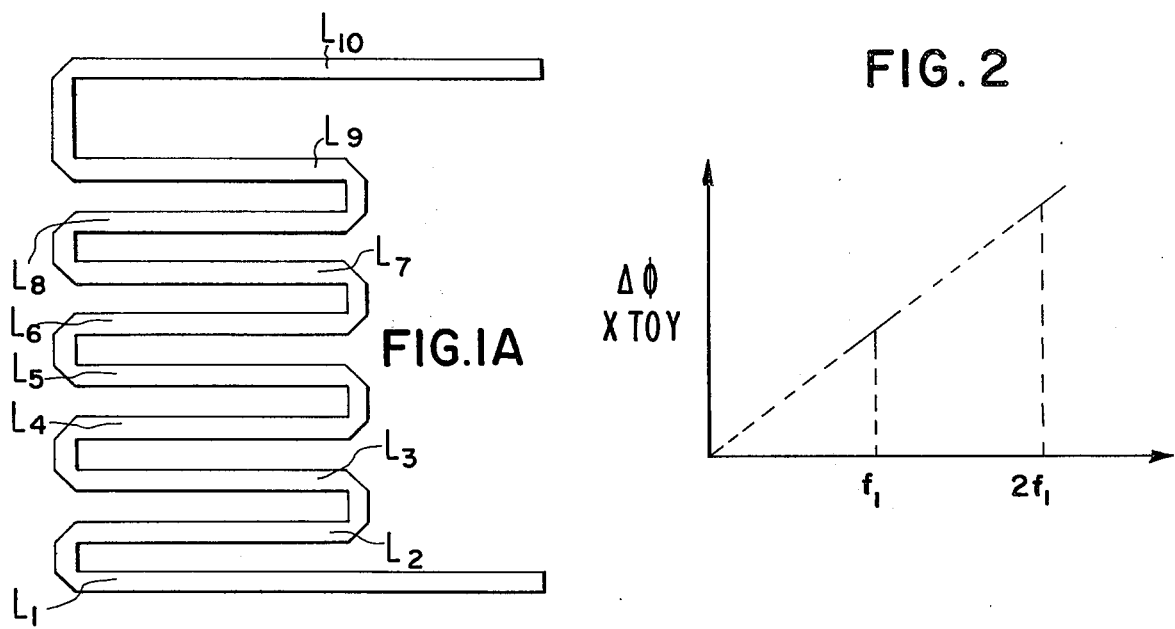
FIG. 1A
FIG. 2
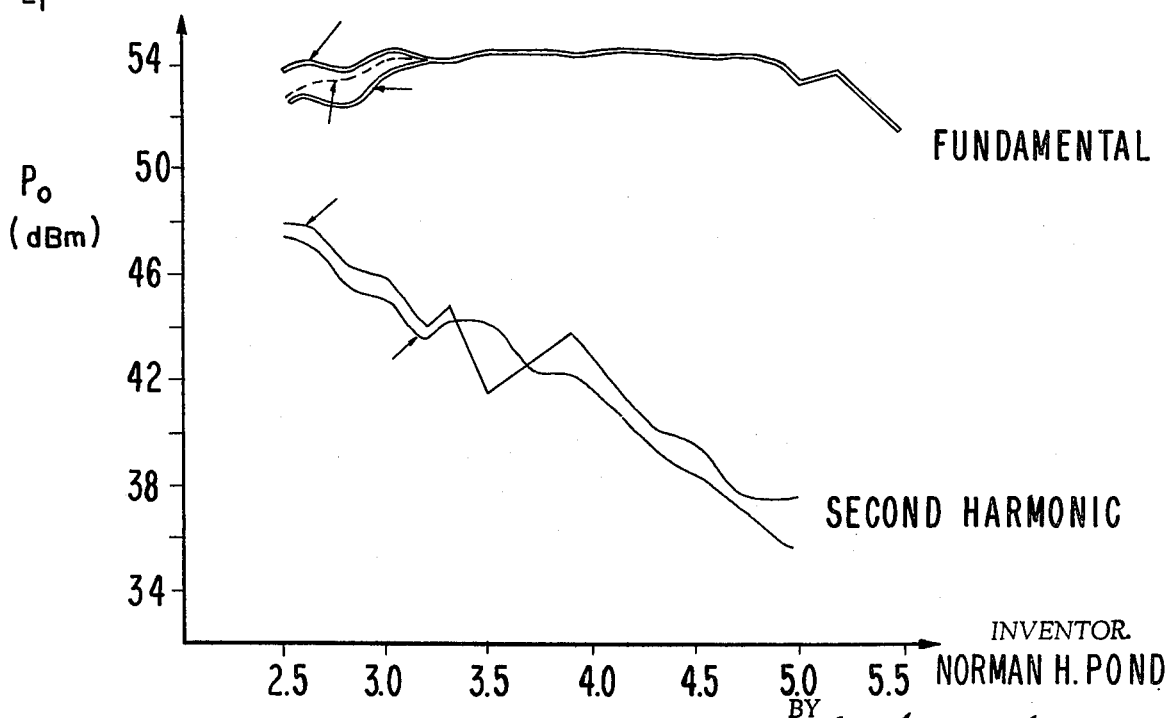
FIG. 3

INVENTOR.
NORMAN H. POND
BY
Limbach, Limbach and Sutto
ATTORNEYS

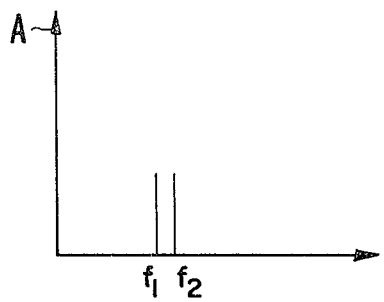
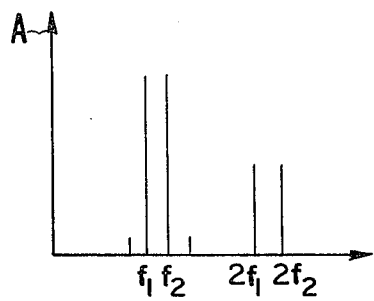
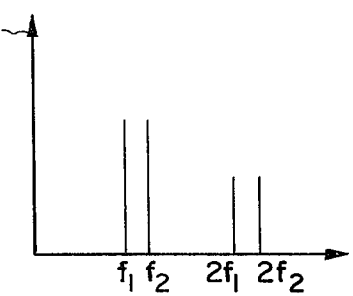
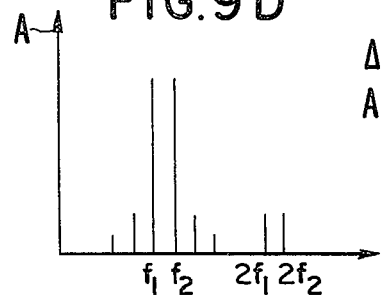
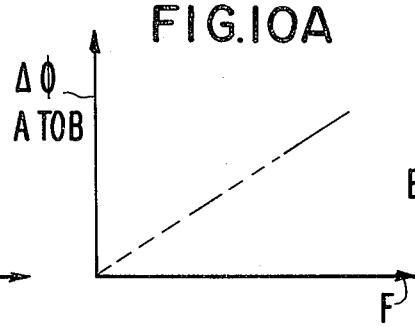
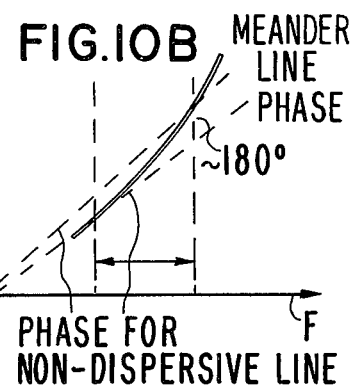
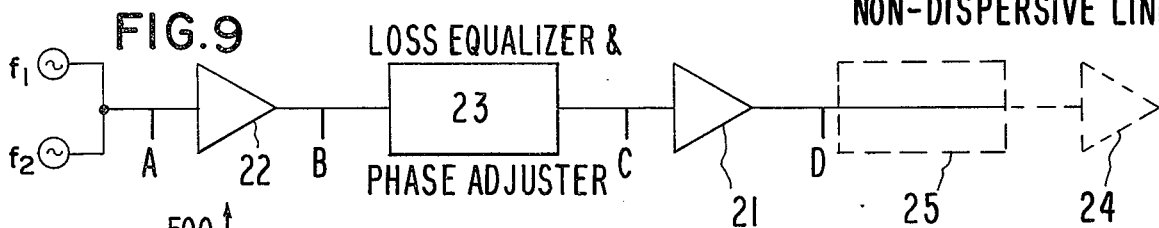
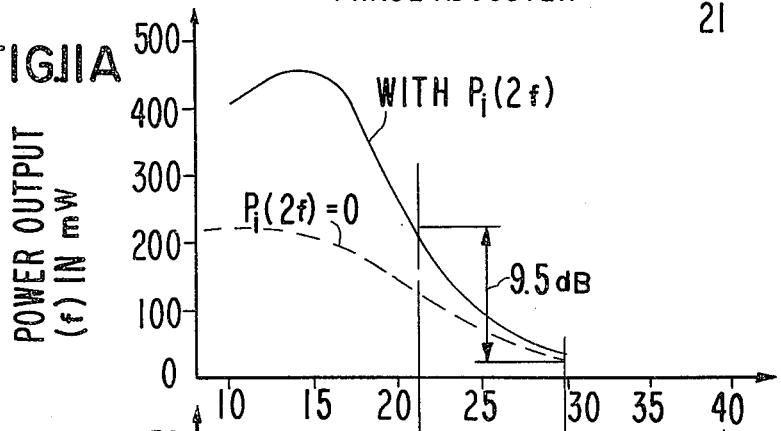
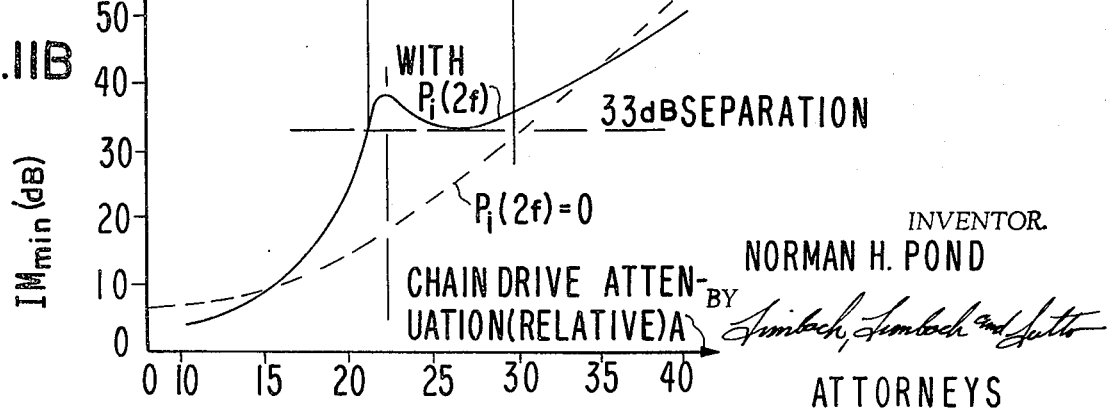

INVENTOR.
NORMAN H. POND
BY
ATTORNEYS

METHOD AND APPARATUS FOR ENHANCING THE OUTPUT FROM A TRAVELING WAVE TUBE

The present invention relates in general to traveling wave tubes and, more particularly, to method and apparatus for enhancing the output of a traveling wave tube over a wide band.

All nonlinear amplifiers produce distortion that results in frequency outputs at multiples of the drive frequency. Since the amplifier can generate only limited power output or voltage, the power output at the fundamental frequency is a nonlinear function of power input. Where there are two or more input signals, intermodulation distortion results.

The level of the harmonic components is a function of the design parameters of the amplifier, operating frequency and power level. In octave bandwidth amplifiers it is not possible to filter out the second harmonic signal since the fundamental and second harmonic signals can exist together within the band. Typical octave bandwidth traveling wave tube amplifiers exhibit amplitude distortion and produce a second harmonic signal that is about 6 dB down at the saturation point when the device is operated near the lower band edge. At higher frequencies and lower drive levels, the separation is greater.

The reason that the level of second harmonic signals is higher at lower frequencies is related to the gain of the device at the second harmonic frequency. When driven at the lower band edge, the gain at the second harmonic is approximately equal to that of the fundamental, and therefore, a small amount of second harmonic power generated near the input of the traveling wave tube is amplified about as much as the fundamental signal. When the tube is driven at higher frequencies, the gain at the second harmonic frequency is extremely low and the amplification is much lower resulting in a lower level of second harmonic output.

Additionally, intermodulation distortion results where multiple signals are amplified simultaneously. This distortion is evident as signals being produced at other than the drive frequencies. For the simple case of two drive signals, $f_1$ and $f_2$, output signals will be produced at $f_1, f_2, 2f_1, 2f_2, 2f_1 - f_2, 2f_2 - f_1$, etc. The latter two signals are referred to as third order intermodulation products and result from the mixing of the second harmonic of one signal with the other signal and vice versa. For typical traveling-wave tubes the amplitude of the third order intermodulation products is about 10 dB below the fundamental signal level at saturation and has a slope of 3 as a function of drive level compared to a slope of 1 for the fundamental signal.

Since the third order intermodulation products are the result of mixing between a fundamental signal and a second harmonic of a nearby signal and the level of the second harmonic is a function of the level of the drive power or the closeness of the power level to the saturation point, the level of second harmonic signal is a measure of the non-linearity of the amplifier, and the higher the non-linearity the higher will be the third order intermodulation products. By reducing the level of second harmonic that a tube produces relative to the fundamental, non-linearity is reduced, and vice-versa.

It is known that second harmonic in the drive signal for a traveling wave tube influences fundamental power output and second harmonic separation as well as the level of third order intermodulation products. The degree of influence is a function of the level of the second harmonic in the drive signal and the phase of the signal relative to the fundamental.

U.S. Pat. No. 3,426,291 describes various arrangements for adjusting the phase of second harmonic drive signals into a traveling wave tube to reduce harmonic and intermodulation distortion in the output. However, the structures described limit the operation of the system to a narrow band. For accomplishing the desired phase adjustment filters and phase shifters, such as circulators, which are dispersive at band edge, are suggested. The use of such structures permits optimization of the system for a particular frequency, but in these devices the rapid change of phase with frequency makes improvement over more than about a few percent bandwidth impossible. This approach also insures that at frequencies near the frequency where improvement is achieved performance degradation will occur.

The object of the present invention is to provide a traveling wave tube with increased power in the fundamental signal frequency over a broad band and reduced intermodulation distortion.

In accordance with the present invention, a second harmonic signal of the fundamental drive signal is applied with the fundamental drive signal to the input of the traveling wave tube and the phase and amplitude of the second harmonic signal relative to the fundamental drive frequency is maintained across the entire operating frequency band of the traveling wave tube to cancel that second harmonic signal which would result within the traveling wave tube from the fundamental drive signal. The present invention employs a dispersive line that provides the proper amount of phase shift in a line length only a few wavelengths long.

In accordance with another aspect of the present invention, provision is made for reduction of intermodulation distortion for those amplifiers not capable of amplifying a phase adjusted second harmonic input signal. In accordance with this aspect of the present invention, third order products are provided in the input signal and phase adjusted to be opposite those the amplifier will produce for cancellation of signals at such frequencies.

The simplest and most straightforward utilization of this invention is establishment of the second harmonic or third order signal externally of the traveling wave tube for introduction into the tube without modification of existing tubes.

In accordance with another aspect of the present invention, the cancellation signal can be established by the tube generating the second harmonic and the output of which it is desired to control. The traveling wave tube can be provided with a slow wave structure, the dispersion of which varies with length. At some point along the slow wave structure, the physical characteristics of the tube are modified in such a way that the phase velocity at the fundamental signal is unchanged but the phase velocity of the second harmonic signal is different to accomplish the desired phase adjustment. Alternatively, the slow wave structure can be provided with resonant attenuation providing much greater loss at the fundamental than at the second harmonic so that the second harmonic propagates on the slow wave structure, the circuit geometry of which is changed following the attenuation for adjustment of the second harmonic phase relative to the fundamental in the manner set forth above.

In accordance with still another embodiment of the present invention, the slow wave structure can be broken and the appropriate phase shift between the second harmonic and the fundamental provided in an electrical line after the break. The electrical line can be a simple meander line located at the break, either inside or outside the vacuum tube envelope. Alternatively, the second harmonic energy can be removed from the circuit prior to a circuit attenuator and reapplied following the attenuator with the appropriate phase shift.

In accordance with still another embodiment of the present invention, second harmonic injection can be used for an amplifier operating over 2 octaves and utilizing 2 drivers. Signals in the lower of the two octaves are amplified in a first driver amplifier which also generates second harmonic signals. The fundamental and second harmonic signal output from this first driver amplifier are phase adjusted in the manner previously described and combined with signals from a second driver amplifier operating on signals in the other octave for application to the 2 octave power amplifier.

In the drawings:

FIG. 1 is a diagrammatic circuit diagram illustrating one embodiment of the present invention.

FIG. 1A is a plan view of a phase adjuster useful in the embodiment of FIG. 1.

FIG. 2 illustrates phase length of a non-dispersive circuit such as a coaxial line or absolutely non-dispersive traveling wave tube.

FIG. 3 is a graph showing power output as a function of frequency for a traveling wave tube when driven with different signals.

FIG. 9 is a diagrammatic view similar to FIG. 1 designating different points along the line for showing indication of intermodulation distortion utilizing the present invention.

FIGS. 9A, 9B, 9C and 9D illustrate power spectra at different points along the line shown in FIG. 8.

FIGS. 10A and 10B are graphs of phase change versus frequency over different portions of the line shown in FIG. 8.

FIGS. 11A and 11B are respectively graphs showing power output and intermodulation separation as a function of drive level to a chain such as shown in FIG. 9.

Figure 13:
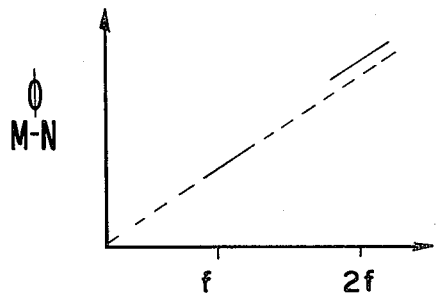
Figure 14:
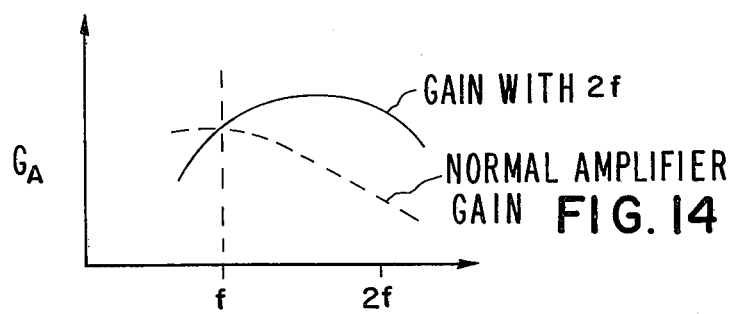

FIGS. 13 and 14 respectively are graphs of phase length and amplifier gain as a function of frequency.

Figure 15:
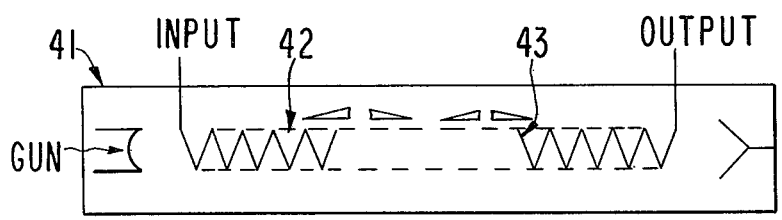
Figure 16:
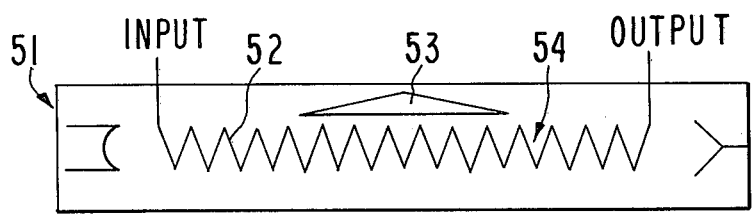

FIGS. 15 and 16 are schematic views of portions of a traveling wave embodying other aspects of the present invention.

Figure 17:
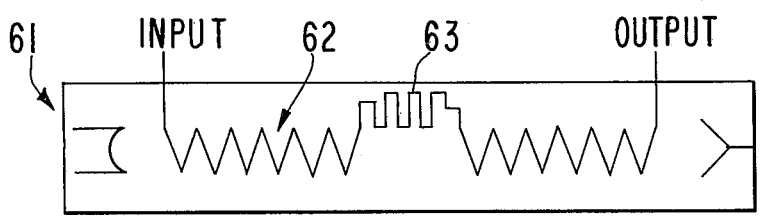
Figure 18:
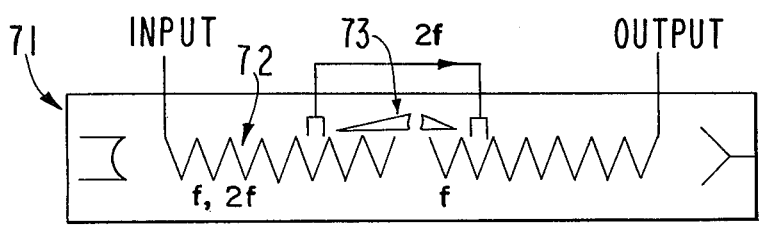

FIGS. 17 and 18 are schematic diagram illustrating other embodiments of this invention.

As pointed out above, the present invention is directed to a distortion or error correction scheme which will be called "anticipation" error correction as contrasted with the more popularly known feedback and feedforward error correction schemes. This invention is directed to introduction of a cancellation signal ahead of an amplifier stage where a distortion signal will be generated with the phase of the cancellation signal adjusted to cancel the subsequently generated distortion signal. Two applications for this new technique are for intermodulation distortion correction and cancellation of harmonic frequency signals in broad band amplifiers, the latter of which will be first described.

Referring now to the drawing, with particular reference to FIG. 1, there is shown a diagrammatic view illustrating one system utilizing the present invention for increasing the fundamental signal output power and decreasing the harmonic signal output power of a traveling wave tube 11 capable of amplifying a harmonic of the fundamental signal. To the traveling wave tube 11 both a fundamental drive signal $f_1$ and a second harmonic signal $2f_1$ are applied in the desired phase relationship as described below by means of, for example, a loss equalizer phase adjusting element 12.

The drive signal $f_1$ and harmonic signal $2f_1$ can be formed in different ways but conveniently are formed in a single amplifier 13 such as a lower power traveling wave tube driven by a drive signal $f_1$.

In the traveling wave tubes 11 and 13 the fundamental drive signal $f_1$ will produce a second harmonic signal $2f_1$. For most traveling wave tubes, the phase relationship between fundamental and second harmonic is relatively constant with frequency; that is, the second harmonic and the fundamental signals are "phase locked." As shown in FIG. 2, a change that produces X° of phase change for the fundamental will produce 2X° for the second harmonic. FIG. 2 illustrates phase length of a non-dispersive circuit such as a coaxial line or absolutely non-dispersive traveling wave tube.

When a non-dispersive traveling wave tube is driven by a frequency $f_1$, signals are produced at $f$ and $2f$. The rate of change of phase length with frequency $d\phi/df$ is constant for the signal at $f_1$ and $2f$ due to the phase locked condition. In other words the rate of change of phase with frequency at the second harmonic is precisely what it would be if the amplifier were operated at that frequency.

For most traveling wave tubes, the fundamental-second harmonic phase relationship produced by the driver will differ approximately 180° from that required for optimum performance of the subsequent amplifier. Thus, it is desired to introduce approximately 180° of dispersion over the octave bandwidth. 180° ± N360° will work satisfactorily only for constant amplitude, constant frequency signals. By utilizing a dispersive line with only 180° of phase shift, i.e. less than one cycle it is possible to achieve exactly the desired conditions at two frequencies separated by an octave. This insures that the phase relationship will be within ± 5° over a 10 percent bandwidth, i.e. the rate of phase change from linearity is 180° over 100 percent bandwidth. By properly shaping the dispersion, even less deviation can be achieved over greater bandwidths.

By insuring proper second harmonic-fundamental phase relationship at the input of the power tube 11, maximum fundamental power will be generated.

The basic physical explanation of the result is that as the RF wave is amplified in the traveling wave tube energy is removed from the electron beam and the average velocity of the electron beam is reduced as it passes through the slow wave structure. Thus, near the output, as the amplifier approaches saturation, the nonlinearity increases rapidly.

By injecting second harmonic into the input of the amplifier 11 I am effectively creating another nonlinearity that partially cancels the one the amplifier normally produces. Without second harmonic injection, the second harmonic builds up along the amplifier 11 with a slope of 2 with distance. Injection of the second harmonic results in straightforward amplification of this signal, the level of which will increase with a slope of 1. Provided the phase is selected properly, this signal will at some point be equal to and opposite in phase to a signal that is produced by the basic nonlinearity of the amplifier 11. The net result of this phenomenon is a tremendous reduction, or even elimination, of second harmonic output, a significant reduction in amplitude nonlinearity (compression) and greatly reduced AM to PM conversion. These two factors produce a greatly reduced level of intermodulation distortion. This invention can be characterized as anticipation error correction as contrasted with feedback and feedforward error correction.

For cancellation of the internally generated second harmonic of tube 11 with the input second harmonic, the length of line between the driver tube 13 and the power tube 11 should provide N wavelengths at the fundamental signal frequency and 2N + ½ wavelengths at the second harmonic frequency.

FIG. 3 shows a graph of the fundamental power output and second harmonic output and their separation as a function of frequency for typical 220-watt traveling wave tubes operated at saturation. As is apparent from the graph, the fundamental power output decreases and the second harmonic output increases at the lower end of the band when no phase adjuster is provided. When the second harmonic drive signal is filtered out such as with a low pass filter, the fundamental power output increases at the lower end of the band, and when the phase adjuster is added, the fundamental power output is increased and the second harmonic output is decreased at the lower end of the band.

Figure 4:
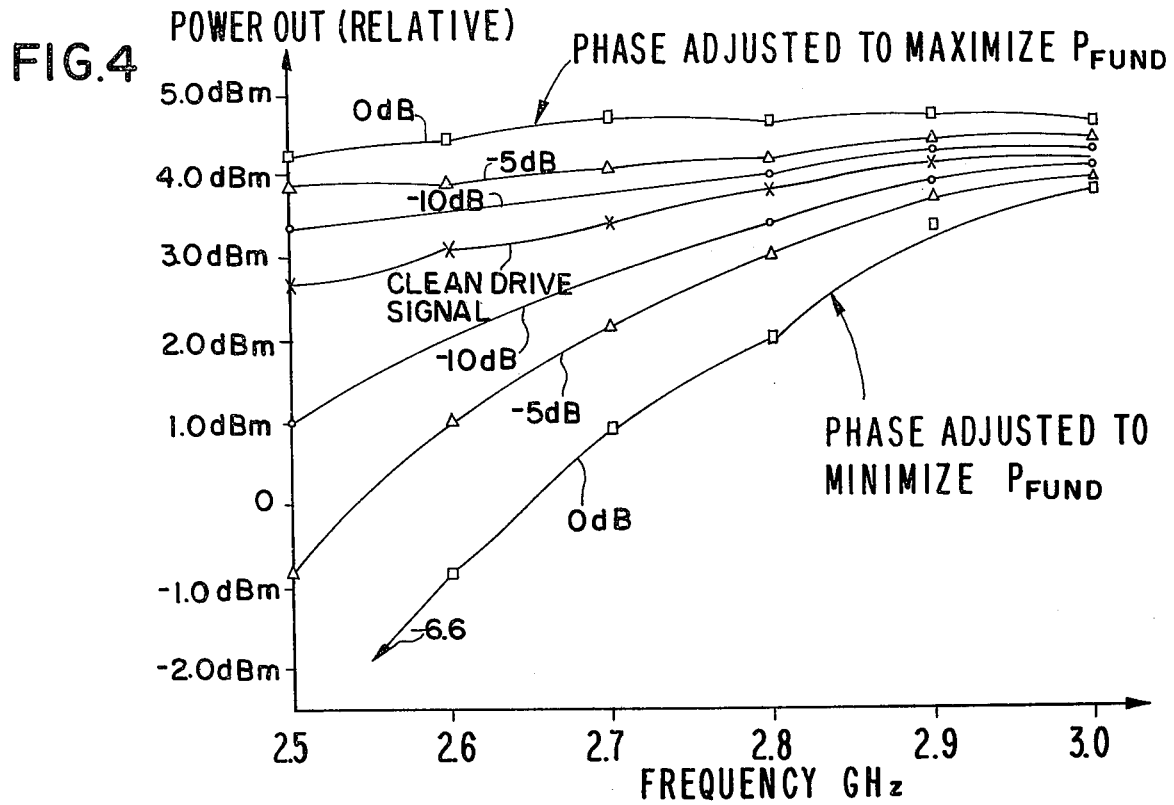
FIG. 4 is a graph showing fundamental power relative to that obtained with no second harmonic in the drive signal as a function of second harmonic level.
Figure 5:
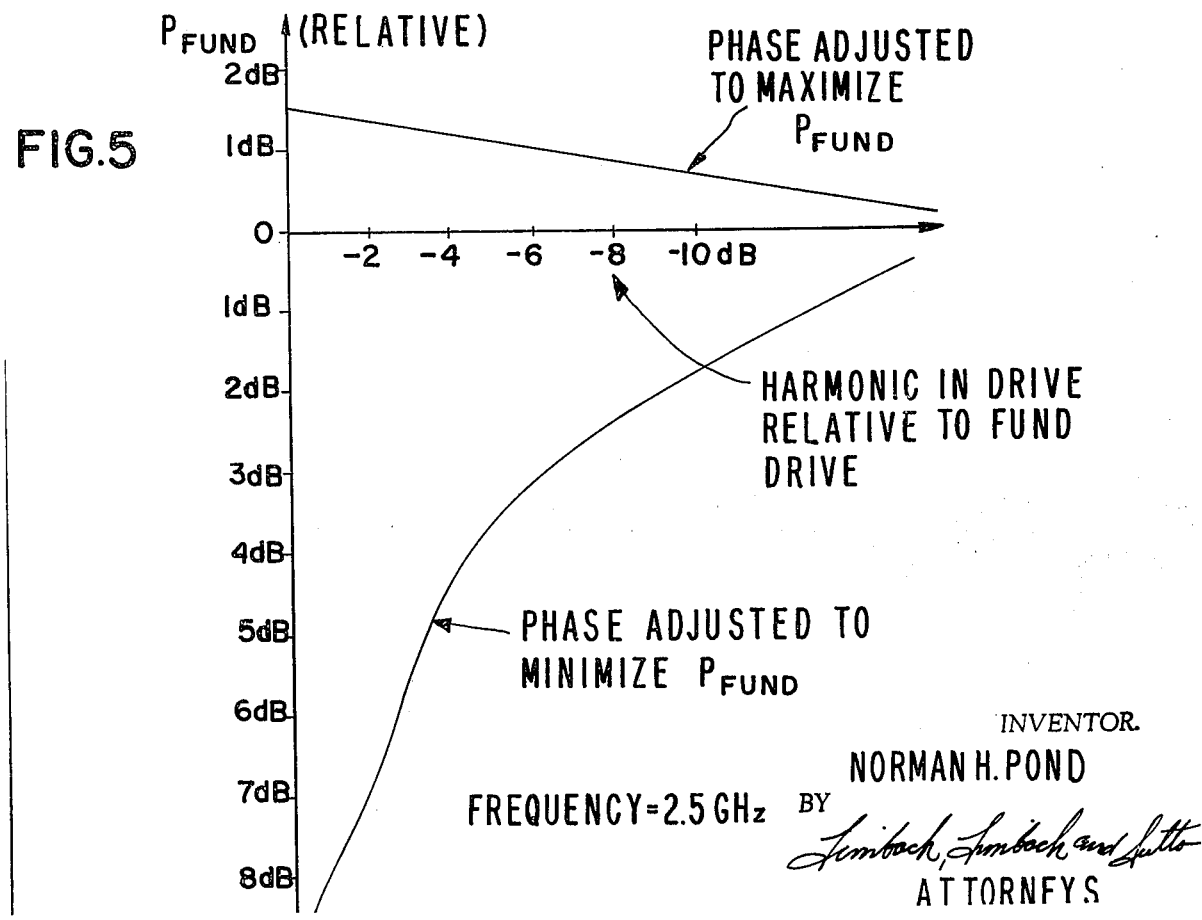
FIG. 5 is a graph showing fundamental power relative to that obtained with no second harmonic in the drive signal as a function of second harmonic level with the phase adjusted to maximize and minimize fundamental power output.
Figure 6:
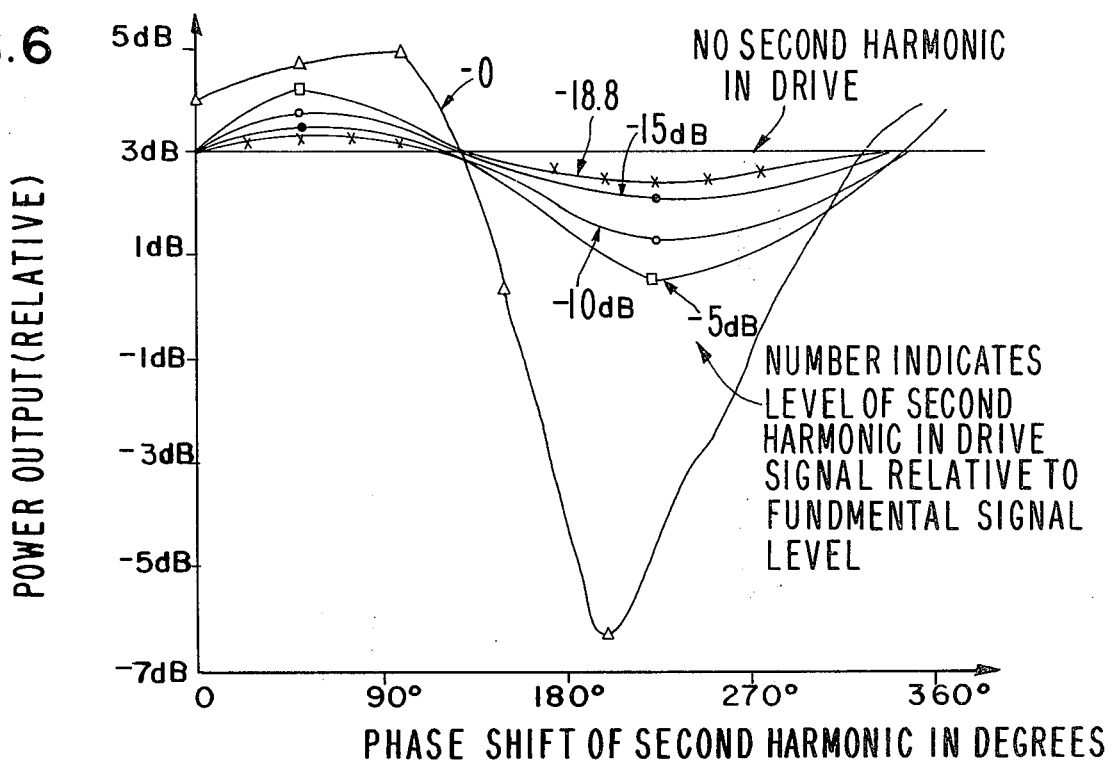
FIG. 6 is a graph showing power output as a function of phase between fundamental and second harmonic drive signal with signal level as a parameter.

FIGS. 4, 5, and 6 show the effect of second harmonic level and phase on the power output of a typical octave bandwidth 220-watt amplifier and illustrate the importance of having a broadband device. FIG. 4 is a graph of power output as a function of frequency for such a traveling wave tube when driven with a clean drive signal and when driven with signals containing a second harmonic content 10 dB below the fundamental, 5 dB below the fundamental and equal to the fundamental. For each of the three different drive signal levels the phase of the second harmonic signal has been adjusted both to optimize power output and to minimize power output. As is apparent, the level and phase of the second harmonic drive signal has a profound effect on the power output. At the lower band edge, when the second harmonic is 5 dB below the fundamental drive signal, optimum phase can result in a half dB increase in power output and improper phase results in more than 1½ dB reduction in power output. Also, where phase becomes adjusted such as to minimize power output, as can happen when utilizing a narrow band system of the type shown in the prior art, the resultant output using second harmonic power in the drive can be worse than the ouptut without the use of second harmonic drive.

FIG. 5 is a graph of the fundamental power relative to that obtained with no second harmonic in the drive signal as a function of second harmonic level for the two limiting cases. FIG. 6 shows power output as a function of phase between fundamental and second harmonic drive signal with level as a parameter.

Figure 7:
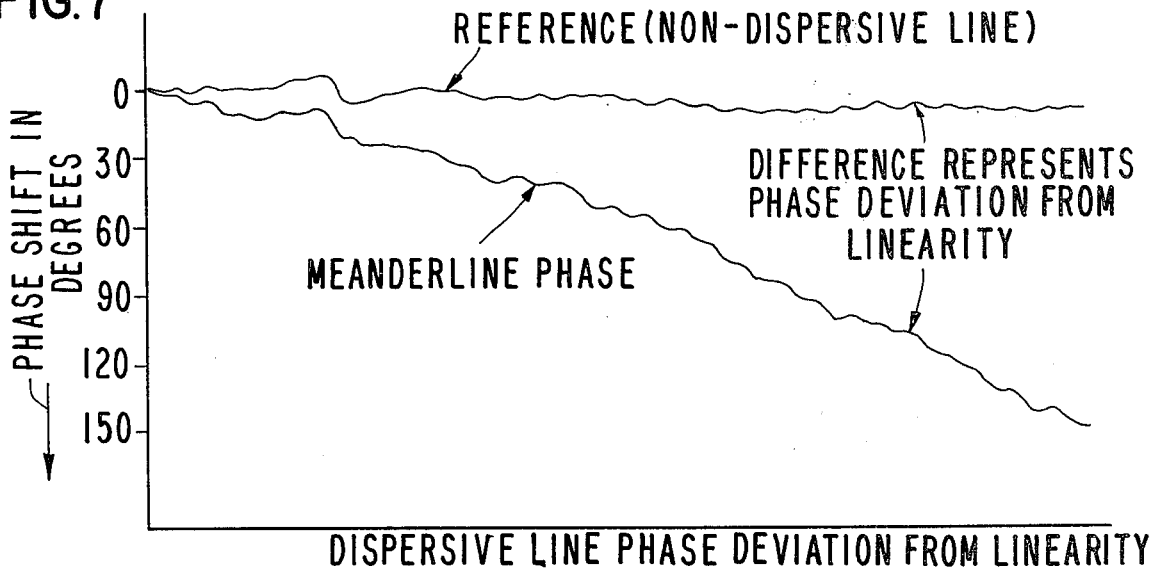
FIG. 7 is a graph showing the phase deviation from linearity for a phase adjusting line in accordance with the present invention.

A highly dispersive line can be constructed that provides the proper amount of phase shift in a line length only a few wavelengths long. On construction giving optimum results is a simple meander line constructed in microstrip form. Phase shift versus frequency for this line is shown in FIG. 7 relative to a non-dispersive line with the same electrical lengths at the lower band edge. Data shown is for a line that gives approximately 130° dispersion at 5.5 GHz compared to 2.5 GHz. Due to the relatively short length of the line, the insertion loss is very low, being less than 1 dB. The particular line which was designed to be approximately 50 ohms impedence exhibits less than 2:1 VSWR for the frequency range of interest.

The microstrip circuit used in the embodiment described above is illustrated in FIG. 1A consisting of a meander line produced by exposure and etching to leave a gold plating approximately 0.0002 – 0.0004 inch thick on a thin chrome or molybdenum surface on an alumina ceramic substrate. The line, typically 0.025 inches wide, had leg length from end to end as listed in the following table with the strip length between all but legs $L_9$ and $L_{10}$ as 0.025 inches and with the strip length between legs $L_9$ and $L_{10}$ as 0.075 inches.

| leg | length | leg | length |
| --- | --- | --- | --- |
| $L_1$ | .530" | $L_6$ | .255" |
| $L_2$ | .302" | $L_7$ | .241" |
| $L_3$ | .290" | $L_8$ | .228" |
| $L_4$ | .285" | $L_9$ | .215" |
| $L_5$ | .269" | $L_{10}$ | .480" |

In almost every construction in which the invention has been tested, there has been an improvement in fundamental output power. The improvement ranges from 0.3 dB to 1.0 dB.

Figure 8:
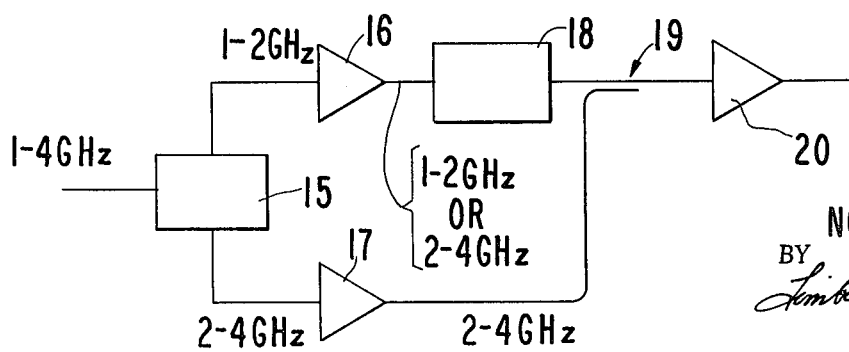
FIG. 8 is a diagrammatic circuit diagram illustrating another embodiment of the present invention.

The embodiment of the invention described above relates prinicipally to a one octave bandwidth tube. In accordance with as aspect of the present invention, appropriate injection of second harmonic drive signals for a 2 octave bandwidth tube can be achieved using two driver tubes. As shown in FIG. 8, signals over a 2 octave bandwidth, such as 1–4 GHz, are divided in a diplexer 15 of the signals in the lower octave, such as 1–2 GHz, directed to one driver amplifier 16 and the signals in the other octave, such as 2–4 GHz, directed to the other driver amplifier 17. The signals from the lower octave amplifier 16 which includes fundamental and second harmonic signals are passed through a phase adjuster 18 and a coupler 19 where output signals from the amplifier 17 are coupled to the line for input to the power amplifier 20. The desired phase adjustment of the second harmonic signal relative to the fundamental in accordance with this invention is accomplished in the phase adjuster 18 for application to the amplifier 20 wherein signals over the two octaves are amplified.

As pointed out above, reduction of second harmonic output can also reduce intermodulation distortion.

FIG. 9 is a schematic circuit similar to FIG. 1 illustrating operation of the present invention for reduction of intermodulation distortion, FIGS. 9A and 9D being graphs showing power versus frequency at selected positions A–D along the line in FIG. 9 and FIGS. 10A and 10B, respectively, being graphs showing phase shift versus frequency over portions A–B and B–C of the line shown in FIG. 9.

Without utilization of the present invention a traveling wave tube power amplifier 21 shown in FIG. 9 would produce undesirably high third order products from input signals $f_1$ and $f_2$ introduced into the amplified chain. In accordance with the present invention, the input signals $f_1$ and $f_2$ drive an amplifier 22 which produces outputs at $f_1$, $f_2$, $2f_1$, $2f_2$ and intermodulation frequencies. This amplifier 22 operates well below saturation and intermodulation frequencies are at very low levels. These signals pass through a microwave circuit 23 that exhibits more loss at $f$ than at $2f$ and has approximately 180° dispersion at $2f$ across the amplification band for signals $f$. This second harmonic band introduced into traveling wave tube 21 exactly cancels that which would normally be generated by tube 21 with resultant elimination or substantial reduction in third order intermodulation signals.

FIGS. 11A and 11B, respectively, show graphs of power output and intermodulation separation as a function of drive level to a chain such as shown in FIG. 9 for the first case (in dashed line) where no second harmonic is injected into the second amplifier 21 and for the second case (solid lines) where second harmonics are injected and conditions optimized at a point approximately 3 dB below the maximum power output. The curves showing no second harmonic injection, i.e. conventional operation, illustrate that at saturation the third order intermodulation products are about 9 dB below saturation, and in order to obtain third order products 36 dB below the fundamental as might be desired in a particular application, the amplifier 21 must be operated more than 10 dB below saturation. Performance is markedly different with second harmonic injection. First, it is apparent that maximum power output has been increased by a factor of more than 2. Secondly, with the conditions optimized and with power output 3 dB below the maximum capability (this corresponds to the maximum power output with no second harmonic injection), the intermodulation separation is 33 dB for third and all higher intermodulation products. This represents a 9.5 dB increase in power output capability in the situation where there is a requirement that intermodulation products be 33 dB below the fundamental.

For amplifiers that are not capable of amplifying the second harmonic signal but do produce a second harmonic output, intermodulation distortion is eliminated or substantially reduced by driving the amplifier with the conventional drive signals as well as third order products which are phase adjusted to be opposite to those that the amplifier will produce itself. This aspect of the present invention can be accomplished by utilizing the amplifier chain shown in FIG. 9 to drive the power amplifier 24, and rather than minimizing the third order intermodulation signals from tube 21, the phase of these intermodulation signals is adjusted in adjuster 25 to be opposite that of the third order products normally produced in the following power amplifier 25. As pointed out above, the total phase adjustment of the signals for opposition is less than one cycle, i.e. an angle such as 180° ± N360° will not work satisfactorily.

Figure 12:
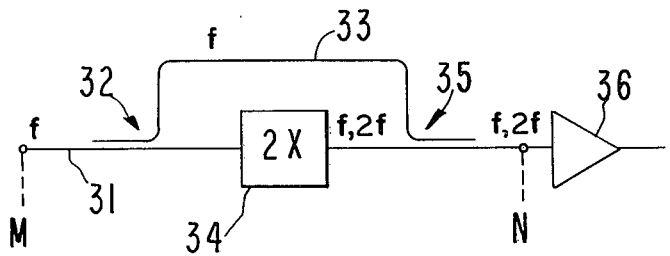
FIG. 12 is a diagrammatic circuit diagram illustrating another embodiment of the present invention.

Referring now to FIGS. 12 and 13, there is shown a circuit which generates the second harmonic with optimum absolute phase and amplitude relative to the fundamental through the use of non-resonant, passive circuit elements. As shown in FIG. 12, the fundamental signal introduced onto line 31 at point M is coupled via a coupler 32 and by-pass line 33 around a multiplier 34 which multiplies the fundamental and has outputs at f and 2f. The two lines are again coupled together via a coupler 35 for application of the signal f and 2f properly adjusted as to phase into the power amplifier 36. The line length between points 1 and 2 for either path differs by no more than ½ at the second harmonic. With the characteristics of tube 36, the deviation of phase from linearity between points M and N is selected to provide the optimum phase for intermodulation distortion reduction. (See FIG. 13)

FIG. 14 is a graph showing gain of the amplifier plotted versus frequency and wherein the normal amplifier gain is shown by the dashed line where second harmonic injection is not utilized. The solid line shows amplifier gain utilizing the present invention where excellent intermodulation distortion reduction is achieved.

While the present invention is ideally suited for second harmonic and intermodulation distortion reduction by external operation on presently available traveling wave tubes, the invention can also be utilized by internal modification of traveling wave tubes to achieve the desired results.

In accordance with one aspect of the present invention schematically illustrated in FIG. 15, the desired second harmonic signal for cancellation is established internally of the tube 41 utilizing a slow wave structure 42 for the tube that has dispersion which varies with length. At some point 43 along the slow wave structure the physical characteristics of the tube are modified in such a way that the phase velocity at the fundamental signal is unchanged, but the phase velocity of the second harmonic signal is different. Therefore, the second harmonic energy that is propagating on the slow wave structure will become out of phase with the second harmonic energy in the electron beam and establish the necessary cancellation process. The phase velocity change or the second harmonic signal can be accomplished by varying one or more of a number of the tube parameters such as helix pitch, shell diameter, helix support rod diameter, etc.

Instead of the construction illustrated in FIG. 15, the traveling wave tube structure 51 can take the form as shown in FIG. 16 wherein resonant attenuation 53 is provided along the slow wave structure 52 presenting much higher loss to the fundamental signal than to the second harmonic. Following the attenuation 53, the circuit geometry 54 is changed to adjust the second harmonic phase velocity relative to the fundamental phase velocity in accordance with the requirements described above.

In accordance with still another aspect of the present invention, schematically illustrated in FIG. 17, the slow wave structure 62 of a traveling wave tube 61 can be broken and the appropriate phase shift between the second harmonic and the fundamental provided in an electrical line at the break. By way of example, a simple meander line 63 located at the break can be utilized to establish the desired phase shift. This electrical line can be located either within the vacuum tube of the envelope or outside the vacuum tube of the envelope.

Instead of the structure shown in FIG. 17, the traveling wave tube 71 as shown in FIG. 18 can be constructed to remove the second harmonic energy from the slow wave circuit 72 prior to the conventional attenuator 73 where the circuit is severed. The second harmonic signal can then be reapplied to the slow wave circuit following the attenuator with the appropriate phase adjustment.

What is claimed is:

1. A microwave amplification circuit comprising:
   a first microwave amplifying means of at least an octave bandwidth having an input and an output,
   a second microwave amplifying means of at least an octave bandwidth having an input connected to receive and amplify signals from the output of said first amplifier,
   both of said amplifying means constructed to amplify a fundamental microwave signal and producing a second harmonic signal of such fundamental signal during amplification of said fundamental signal, and
   a dispersive delay line connected in circuit between the output of said first amplifying means and the input of said second amplifying means,
   said delay line constructed to shift the phase between a fundamental signal and a second harmonic of such fundamental signal from the output of said first amplifying means at the input of said second amplifying means by less than one cycle for optimum suppression at frequencies within at least plus or minus 20 percent of the upper frequency of the octave.

2. The circuit of claim 1 wherein said first and second amplifying means comprise a traveling-wave tube having a slow wave structure and said dispersive delay line forms a part of said slow wave structure.

3. The circuit of claim 1 wherein said first and second amplifying means comprise a traveling-wave tube having a slow wave structure and said dispersive delay line is connected between a break in the slow wave circuit of said tube.

4. The circuit in accordance with claim 1 wherein said dispersive delay line is a microstrip meander line.

* * * * *